United States Patent
Wei et al.

(10) Patent No.: US 12,300,460 B2
(45) Date of Patent: May 13, 2025

(54) POWER ADJUSTMENT METHOD OF UPPER ELECTRODE POWER SUPPLY AND SEMICONDUCTOR PROCESS APPARATUS

(71) Applicant: BEIJING NAURA MICROELECTRONICS EQUIPMENT CO., LTD., Beijing (CN)

(72) Inventors: Jing Wei, Beijing (CN); Yu Zhang, Beijing (CN); Gang Wei, Beijing (CN); Jing Yang, Beijing (CN); Guibin Wang, Beijing (CN); Xin Yue, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/553,561

(22) PCT Filed: Mar. 16, 2022

(86) PCT No.: PCT/CN2022/081077
§ 371 (c)(1),
(2) Date: Sep. 30, 2023

(87) PCT Pub. No.: WO2022/206381
PCT Pub. Date: Oct. 6, 2022

(65) Prior Publication Data
US 2024/0194441 A1    Jun. 13, 2024

(30) Foreign Application Priority Data

Apr. 1, 2021    (CN) .......................... 202110356810.0

(51) Int. Cl.
*H01J 37/244* (2006.01)
*H01J 37/32* (2006.01)

(52) U.S. Cl.
CPC ...... *H01J 37/244* (2013.01); *H01J 37/32568* (2013.01); *H01J 37/32899* (2013.01);
(Continued)

(58) Field of Classification Search
None
See application file for complete search history.

(56) References Cited

U.S. PATENT DOCUMENTS 6,635,578 B1 * 10/2003 Xu .................... H01J 37/32009
                                                      438/712
6,794,129 B1 *  9/2004 Telles .................... C12Q 1/703
                                                      435/7.1
(Continued)

FOREIGN PATENT DOCUMENTS

CN    112530773 A    3/2021
CN    113113282 A    7/2021
(Continued)

OTHER PUBLICATIONS

The World Intellectual Property Organization (WIPO) International Search Report for PCT/CN2022/081077 May 25, 2022 5 Pages (including translation).
(Continued)

*Primary Examiner* — Srinivas Sathiraju
(74) *Attorney, Agent, or Firm* — ANOVA LAW GROUP, PLLC

(57) ABSTRACT

The present disclosure provides a power adjustment method of an upper electrode power supply of a semiconductor process apparatus. The method includes obtaining a processing load of an upper electrode power supply of a reference process chamber and a processing load of an upper
(Continued)

electrode power supply of a current process chamber corresponding to semiconductor process step, when starting to perform a semiconductor process step, determining a power compensation coefficient for the current process chamber relative to the reference process chamber based on the processing load of the current process chamber and the processing load of the reference process chamber, and controlling the upper electrode power supply to output compensation power. The compensation power is a product of the set power of the upper electrode power supply of the current process chamber corresponding to the semiconductor process step and the corresponding power compensation coefficient.

12 Claims, 10 Drawing Sheets

(52) U.S. Cl.
CPC .............. *H01J 2237/24564* (2013.01); *H01J 2237/2485* (2013.01); *H01J 2237/334* (2013.01)

(56) References Cited

U.S. PATENT DOCUMENTS

| | | | | |
|---|---|---|---|---|
| 7,632,635 | B2* | 12/2009 | Telles | C12Q 1/703 435/5 |
| 8,258,283 | B2* | 9/2012 | Lee | C12Q 1/707 435/6.12 |
| 9,119,283 | B2* | 8/2015 | Albarede | H01J 37/32899 |
| 9,412,670 | B2* | 8/2016 | O'Neill | H01J 37/32935 |
| 10,157,730 | B2* | 12/2018 | Marakhtanov | H01J 37/32183 |
| 10,249,476 | B2* | 4/2019 | Marakhtanov | H01J 37/32183 |
| 10,607,815 | B2* | 3/2020 | Ghantasala | H01J 37/32183 |
| 10,622,217 | B2* | 4/2020 | Park | H01J 37/32532 |
| 10,971,335 | B2* | 4/2021 | Kim | H01J 37/32926 |
| 11,075,088 | B2* | 7/2021 | Park | H01L 21/67069 |
| 11,075,089 | B2* | 7/2021 | Park | H01J 37/32165 |
| 2004/0224311 | A1* | 11/2004 | Telles | C12Q 1/703 435/5 |
| 2009/0253122 | A1* | 10/2009 | Telles | C12Q 1/703 435/5 |
| 2010/0209903 | A1* | 8/2010 | Telles | C12Q 1/703 435/5 |
| 2013/0309421 | A1* | 11/2013 | Smith | C23C 14/221 427/595 |
| 2014/0034612 | A1* | 2/2014 | Yang | H01L 21/67109 216/71 |
| 2014/0265851 | A1* | 9/2014 | Albarede | H01J 37/32899 315/111.21 |
| 2014/0349417 | A1* | 11/2014 | O'Neill | H01J 37/3299 156/345.28 |
| 2016/0118227 | A1* | 4/2016 | Valcore, Jr. | H01J 37/32165 216/61 |
| 2017/0310227 | A1* | 10/2017 | Zhang | H02M 3/1584 |
| 2019/0172683 | A1* | 6/2019 | Mavretic | H03K 17/687 |
| 2019/0267212 | A1* | 8/2019 | Mavretic | H03F 3/24 |
| 2020/0006039 | A1* | 1/2020 | Ghantasala | H01J 37/32458 |
| 2020/0043709 | A1* | 2/2020 | Agarwal | C23C 16/45544 |
| 2020/0051787 | A1* | 2/2020 | Shinagawa | H01J 37/32183 |
| 2020/0168439 | A1* | 5/2020 | Bhutta | H01J 37/32183 |
| 2021/0241996 | A1* | 8/2021 | Carter | H01J 37/32137 |
| 2021/0327684 | A1* | 10/2021 | Bhutta | H01J 37/3299 |
| 2023/0102487 | A1* | 3/2023 | Hopkins | H01J 37/32642 315/111.21 |
| 2023/0215692 | A1* | 7/2023 | Hua | H01J 37/32385 438/798 |
| 2024/0006170 | A1* | 1/2024 | Wei | H01J 37/3299 |
| 2024/0194441 | A1* | 6/2024 | Wei | H01J 37/32568 |

FOREIGN PATENT DOCUMENTS

| | | |
|---|---|---|
| KR | 20140138077 A | 12/2014 |
| TW | 200739723 A | 10/2007 |
| TW | 201633853 A | 9/2016 |
| WO | 2006021251 A1 | 3/2006 |
| WO | 2020256899 A1 | 12/2020 |

OTHER PUBLICATIONS

Intellectual Property Office of Singapore Search Report for Application No. 11202307357W Apr. 1, 2021 9 page.

* cited by examiner

POWER ADJUSTMENT METHOD OF UPPER ELECTRODE POWER SUPPLY AND SEMICONDUCTOR PROCESS APPARATUS

CROSS-REFERENCE TO RELATED APPLICATIONS

This application is a national phase entry under 35 U.S.C. § 371 of International Application No. PCT/CN2022/081077, filed on Mar. 16, 2022, which claims priority to Chinese Application No. 202110356810.0 filed on Apr. 1, 2021, the entire contents of both of which are incorporated herein by reference.

TECHNICAL FIELD

The present disclosure generally relates to the semiconductor process field and, more particularly, to a power adjustment method of an upper electrode power supply and a semiconductor process apparatus.

BACKGROUND

With the rapid development of semiconductor device manufacturing processes, requirements for device performance and integration have become higher and higher. Plasma technology has been widely used. In a plasma etching or deposition system, by introducing various reaction gases (such as $Cl_2$, $SF_6$, $C_4F_8$, $O_2$, etc.) into a vacuum process chamber, bound electrons in a gas atom are freed from potential wells by applying an external electromagnetic field (DC or AC). Then, free electrons with kinetic energy collide with molecules, atoms, or ions to completely deionize the gases to form the plasma. The plasma includes a large number of active particles such as electrons, ions (including positive and negative ions), excited-state atoms, molecules, and radicals. These active particles interact with a wafer surface placed in the chamber and exposed to the plasma, which causes various physical and chemical reactions on the wafer surface to change the performance of the material surface to complete the etching or another process processing. In developing the plasma apparatus for the semiconductor manufacturing process, a most important factor is to improve the processing capability on the substrate to improve productivity and the capability to manufacture highly integrated devices.

As the feature size of integrated circuits continues to shrink, the required processing processes become increasingly stringent. One important requirement is etching product consistency. In the processing process, a strict requirement needs to be imposed on the process result consistency of all chambers of machines of a same model number. Thus, different chambers need to be controlled through a strict process to realize the process result consistency.

However, in the existing semiconductor process apparatus, state parameters such as plasma density generated in a plurality of process chambers of a plurality of machines are often different, and the process result consistency is poor.

SUMMARY

The present disclosure aims to provide a method for adjusting the power of an upper electrode power supply and a semiconductor process apparatus. The power adjustment method can improve the consistency of plasma parameters in different process chambers, thereby enhancing the consistency of process results.

To realize the above purpose, an aspect of the present disclosure provides a power adjustment method of an upper electrode power supply of a semiconductor process apparatus, including:

obtaining a processing load of an upper electrode power supply of a reference process chamber and a processing load of an upper electrode power supply of a current process chamber corresponding to a semiconductor process step;

when starting to perform the semiconductor process step, determining a power compensation coefficient for the current process chamber relative to the reference process chamber according to the processing load of the current process chamber and the processing load of the reference process chamber corresponding to the semiconductor process step; and controlling the upper electrode power supply of the current process chamber to output a compensation power, the compensation power being a product of a set power of the upper electrode power supply of the current process chamber corresponding to the semiconductor process step and the corresponding power compensation coefficient.

In some embodiments, determining the power compensation coefficient for the current process chamber relative to the reference process chamber according to the processing load of the current process chamber and the processing load of the reference process chamber includes:

calculating a ratio between the processing load of the current process chamber and the processing load of the reference process chamber and using the ratio as the power compensation coefficient.

In some embodiments, upper electrode circuits are arranged at the reference process chamber and the current process chamber, the upper electrode power supply is configured to output power to the corresponding process chamber through a corresponding upper electrode circuit, and obtaining the processing load of the upper electrode power supply of the reference process chamber and the processing load of the upper electrode power supply of the current process chamber corresponding to the semiconductor process step includes:

obtaining a plasma load of the reference process chamber corresponding to the semiconductor process step;

adding the circuit load of the reference process chamber and the plasma load to obtain the processing load of the reference process chamber; and adding the circuit load of the current process chamber and the plasma load of the reference process chamber to obtain the processing load of the current process chamber.

In some embodiments, obtaining the plasma load of the reference process chamber corresponding to the semiconductor process step includes:

when performing the semiconductor process step, controlling the upper electrode power supply of the reference process chamber to output a processing power and detecting a process current between the upper electrode power supply and the reference process chamber;

obtaining the processing load of the reference process chamber according to the processing power and the process current; and subtracting the circuit load of the reference process chamber from the processing load of the reference process chamber to obtain the plasma load of the reference process chamber.

In some embodiments, obtaining the processing load of the reference process chamber according to the processing power and the process current includes:

calculating a ratio of the processing power to square of the process current and using the ratio as the processing load.

In some embodiments, the circuit load of any one of the reference process chamber and the current process chamber is obtained by:

controlling the upper electrode power supply of the process chamber to output detection power to detect a detection current between the upper electrode power supply ad the process chamber, the plasma being not ignited in the process chamber under the detection power; and obtaining the circuit load of the process chamber according to the detection power and detection current of the process chamber.

In some embodiments, obtaining the circuit load of the process chamber according to the detection power and detection current of the process chamber includes:

calculating a ratio of the detection power to square of the detection current and using the ratio as the circuit load.

The power control method according to claim 3, wherein a plurality of semiconductor process steps are provided.

After obtaining the processing load of the upper electrode power supply of the reference process chamber and the processing load of the upper electrode power supply of the current process chamber corresponding to the semiconductor process step, and before starting to perform all the semiconductor process steps, the method further includes:

writing the obtained plasma load of the reference process chamber corresponding to each semiconductor process step of the plurality of semiconductor process steps into a parameter table;

accessing the circuit load of the reference process chamber and the circuit load of the current process chamber;

when starting to perform the semiconductor process step, determining the power compensation coefficient of the current process chamber relative to the reference process chamber corresponding to the semiconductor process step according to the processing load of the current process chamber and the processing load of the reference process chamber including:

when starting to perform the semiconductor process steps, accessing the plasma load of the reference process chamber corresponding to a current semiconductor process step in the parameter table; and determining the power compensation coefficient of the current process chamber relative to the reference process chamber corresponding to the current semiconductor process step according to the processing load of the current process chamber and the processing load of the reference process chamber.

A second aspect of the present disclosure provides a semiconductor process apparatus comprising a plurality of process chambers, wherein the semiconductor process apparatus is configured to adjust power of upper electrode power supplies of the plurality of process chambers through the power adjustment method of the upper electrode power supply of embodiments of the present disclosure. Any one process chamber of the plurality of process chambers is used as the reference process chamber, and a process chamber of the other process chambers that performs the semiconductor process step is the current process chamber.

The semiconductor process apparatus further includes:

an acquisition unit configured to obtain the processing load of the upper electrode power supply of the reference process chamber and the processing load of the upper electrode power supply of the current process chamber corresponding to the semiconductor process step;

a calculation unit configured to determine the power compensation coefficient for the current process chamber relative to the reference process chamber corresponding to the semiconductor process step according to the processing load of the current process chamber and the processing load of the reference process chamber; and a control unit configured to, when performing the semiconductor process step, control the upper electrode power supply of the current process chamber to output the compensation power, the compensation power being the product of the set power of the upper electrode power supply of the current process chamber corresponding to the semiconductor process step and the corresponding power compensation coefficient.

In some embodiments, the acquisition unit includes a plurality of current detection devices. A number of the current detection devices is the same as a number of the process chambers. The current detection devices are arranged between the electrode power supplies and the corresponding process chambers in a one-to-one correspondence. The current detection devices are configured to obtain the process current and/or the detection current between the corresponding upper electrode power supplies and the corresponding process chambers, and the detection current refers to a current outputted by the upper electrode power supply when the plasma is not ignited in the process chamber.

With the power adjustment method and the semiconductor process apparatus of embodiments of the present disclosure, the power compensation coefficient of the current process chamber relative to the reference process chamber can be obtained according to the processing load of the upper electrode power supply of the reference process chamber and the processing load of the upper electrode power supply of the current process chamber corresponding to the semiconductor process step. The upper electrode power supply of the current process chamber can be controlled to output the compensation power. The compensation power can be the product of the set power of the upper electrode power supply of the current process chamber corresponding to the semiconductor process step and the corresponding power compensation coefficient. Thus, the power applied to the plasma in the current process chamber can remain consistent with the power applied to the plasma in the reference process chamber to improve the parameter consistency of the plasma in different process chambers to further improve the process result consistency.

BRIEF DESCRIPTION OF THE DRAWINGS

The accompanying drawings are provided to further understand embodiments of the present disclosure and form a part of the specification. The accompanying drawings are used to explain the present disclosure with the following detailed embodiments but do not limit the scope of the present disclosure. In the drawings.

DETAILED DESCRIPTION OF THE EMBODIMENTS

Embodiments of the present disclosure are described in detail in connection with the accompanying drawings. It should be understood that the specific embodiments described here are merely used for illustrating and explaining the present disclosure and are not intended to limit the scope of the present disclosure.

Figure 1:
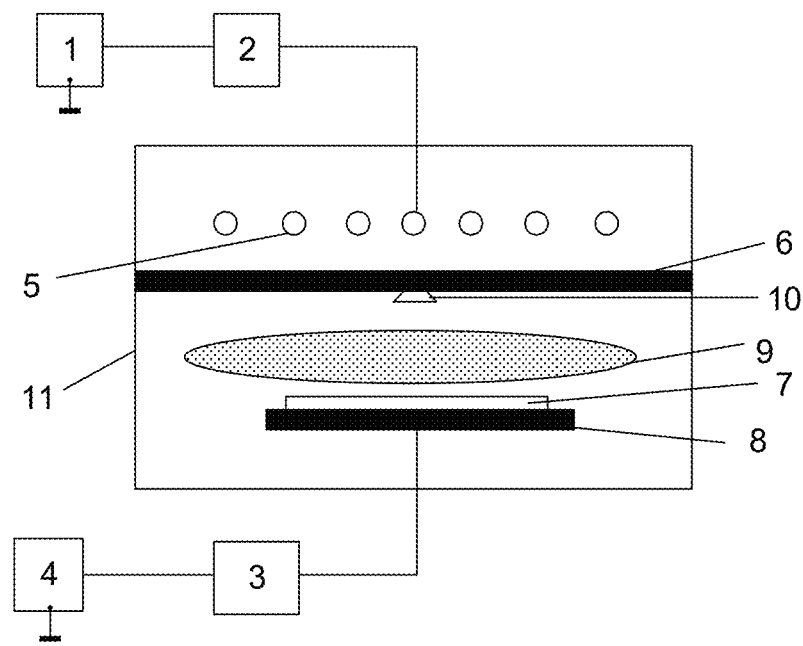
FIG. 1 illustrates a schematic structural diagram of an existing semiconductor process apparatus.

FIG. 1 shows a structure of an existing semiconductor process apparatus. An electrostatic chuck 8 is arranged in a process chamber 11 and configured to carry a wafer 7. A nozzle 10 is arranged at a dielectric window 6 (e.g., a quartz window) at a top of the process chamber 11. A process gas can enter the process chamber 11 through the nozzle 10. An upper electrode power supply can be configured to apply a radio frequency (RF) power to an inductive coupling coil 5 through a matcher 2. The inductive coupling coil 5 can be configured to couple RF energy through the dielectric window 6 into the chamber to excite the process gas in the process chamber 11 to generate a plasma 9 to act on the wafer 7. A bias RF generator 4 can be configured to apply RF energy to the electrostatic chuck 8 (e.g., an RF copper column located at a bottom of the electrostatic chuck) through a matcher 3 to provide an RF field to generate an RF bias voltage to form an ion acceleration sheath layer on the wafer surface to etch the wafer 7.

When the RF power provided by the upper electrode power supply 1 forms an RF current, and the RF current is applied to the inductive coupling coil 5, an induced magnetic field can be generated in the process chamber 11. The induced magnetic field can be time-varying to generate an annular induced electric field, which excites the process gas in the process chamber 11 to form the plasma. When different loaded RF powers are loaded, the state parameter such as the plasma density can change. Thus, the generated process result can change subsequently. Therefore, the overall efficiency of the upper electrode circuit can be closely related to the state consistency of the plasma and the process result.

Figure 2:
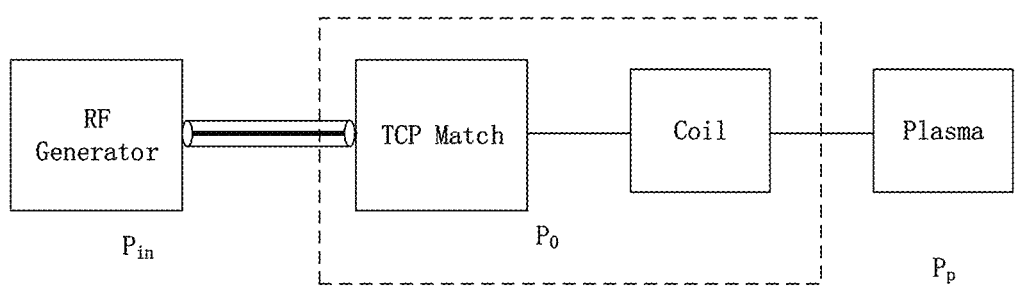
FIG. 2 illustrates a schematic diagram showing a power loss of an upper electrode radio frequency circuit of the semiconductor process apparatus in FIG. 1.
Figure 3:
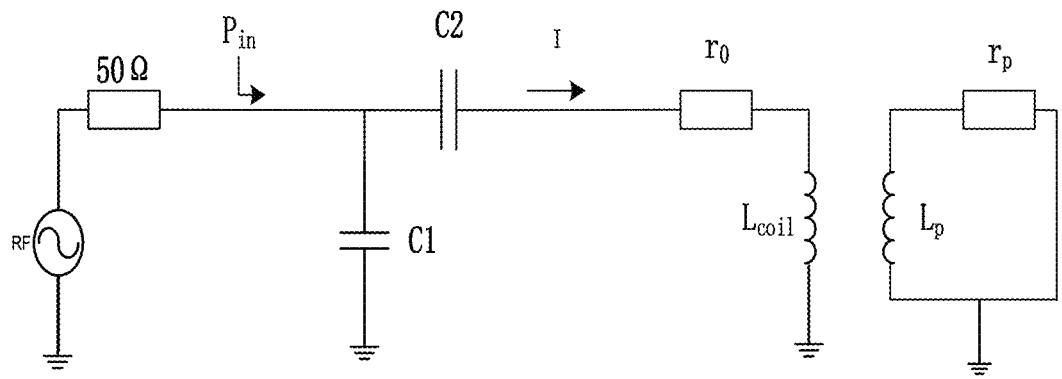
FIG. 3 illustrates a schematic diagram showing an equivalent circuit of the upper electrode radio frequency circuit of the semiconductor process apparatus in FIG. 1.
Figure 4:
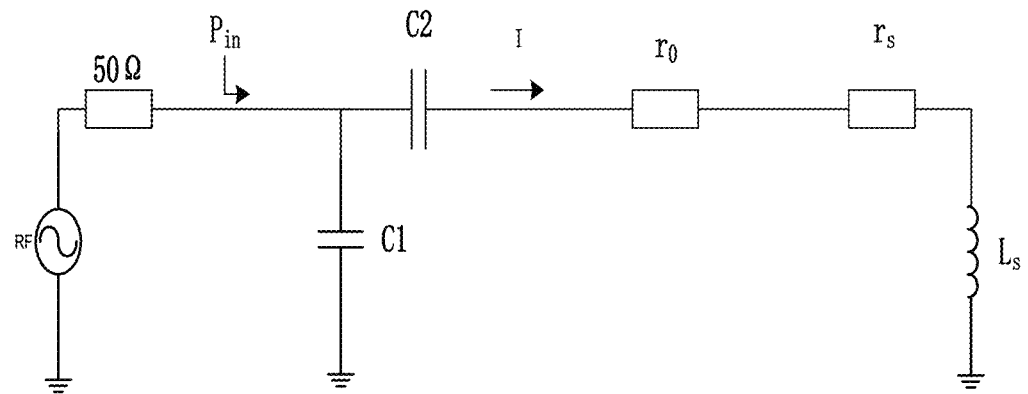
FIG. 4 illustrates a schematic structural diagram after transformation of the equivalent circuit in FIG. 3.

As shown in FIG. 2, the power loss of the upper electrode RF circuit of an Inductively Coupled Plasma (ICP) mainly includes of a matcher loss (TCP Match), a coil loss (Coil), a contact loss, etc. When the output power of the RF generator is $P_{in}$, the matcher loss of the circuit, the coil loss, and the contact loss can be considered as a whole $P_0$. The power utilized by the plasma can be $P_p = P_{in} - P_0$. The efficiency of the upper electrode RF circuit can be set as $\eta$, then $\eta = P_p / P_{in}$. The equivalent circuit of the upper electrode RF circuit is shown in FIG. 3. C1 and C2 are variable capacitors in the upper matcher (i.e., matcher 2 in FIG. 1). A loss resistance of the matcher, a loss resistance of the coil, and a circuit contact resistance can be regarded as an equivalent resistance $r_0$. The equivalent resistance $r_0$ at the upper electrode RF circuit in the context. $L_{coil}$ denotes the coil inductance, $r_p$ is the real part of the impedance of the plasma generated under the transformer model of inductive coupling, $L_p$ is the imaginary part of the equivalent inductance. After impedance equivalent transformation is performed on the backend transformer model, the real part of the backend overall equivalent impedance $r_s$ and the imaginary part of the equivalent inductance $L_s$ are obtained. The equivalent circuit is shown in FIG. 4.

Since the matchers, the coils, and the mounting contact resistances of the upper electrode RF circuits related to the power loss are different between different apparatuses of the same model number (same structure), that is, the overall hardware loss resistances are different, when the output power of the RF generators are the same, the losses of the upper electrode RF circuits can be different. Thus, the power reached to the plasma can be different, and the state parameter such as the generated plasma density can be different, which eventually affects the process result consistency. Therefore, by controlling the consistency of the RF power output by the generator, the consistency of the plasma parameter and the process repeatability can be difficult to guarantee. Process matching of the plurality of apparatuses (improve the reliability) can be more difficult.

Figure 11:
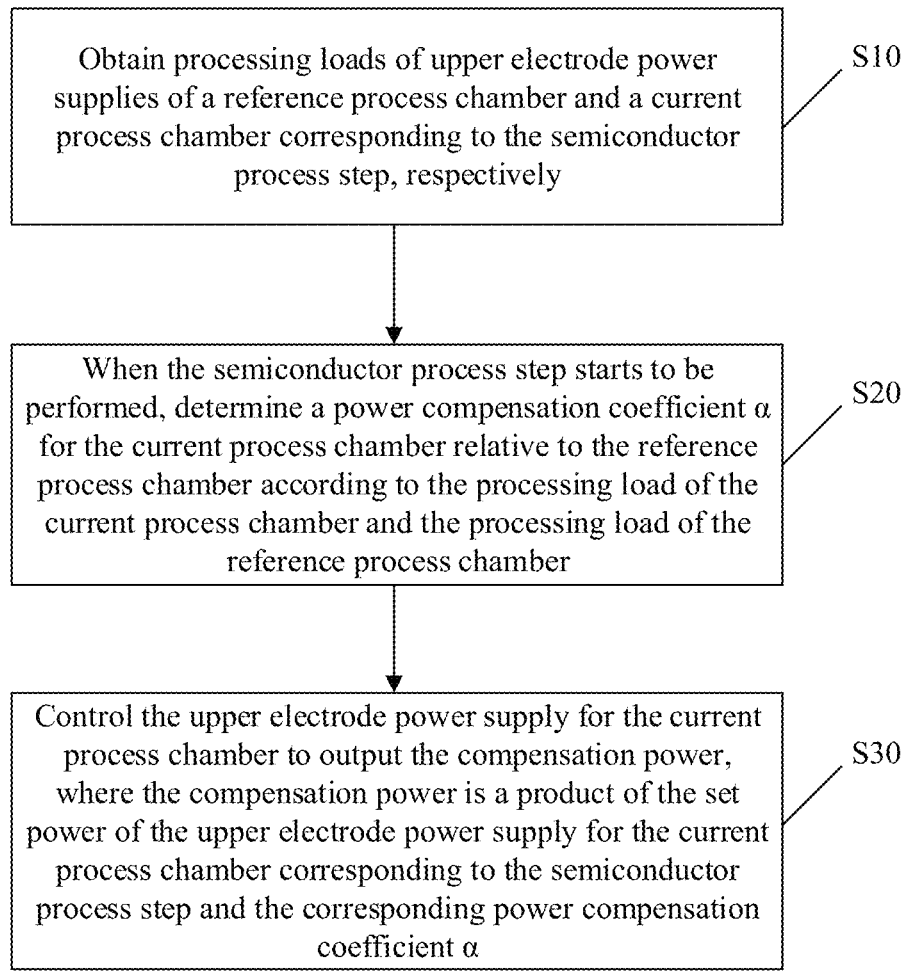
FIG. 11 illustrates a schematic flowchart of a power adjustment method of a power supply of an upper electrode of the semiconductor process apparatus according to an embodiment of the present disclosure.

To address the above technical problems, as an aspect of the present disclosure, a power adjustment method of the upper electrode power supply of the semiconductor process apparatus is provided, as shown in FIG. 11. The method includes the following processes.

At S10, processing loads of upper electrode power supplies of a reference process chamber and a current process chamber corresponding to the semiconductor process step are obtained respectively.

The reference process chamber can be specified from the plurality of process chambers with the same structure. The current process chamber can be any other process chamber performing the semiconductor process step except for the reference process chamber. In addition, the plurality of process chambers with the same structure can belong to the same semiconductor process apparatus or different semiconductor process apparatuses.

At S20, when the semiconductor process step starts to be performed, a power compensation coefficient $\alpha$ for the current process chamber relative to the reference process chamber is determined according to the processing load of the current process chamber and the processing load of the reference process chamber.

At S30, the upper electrode power supply for the current process chamber is controlled to output the compensation power, where the compensation power is a product of the set power of the upper electrode power supply for the current process chamber corresponding to the semiconductor process step and the corresponding power compensation coefficient $\alpha$.

In some embodiments, the above step S20 can specifically include:
calculating a ratio of the processing load of the current process chamber to the processing load of the reference process chamber, and using the ratio as the power compensation coefficient $\alpha$.

However, embodiments of the present disclosure are not limited to this. In practical applications, the power compensation coefficient $\alpha$ can also be determined using other calculation methods according to the processing load of the current process chamber and the processing load of the reference process chamber, which is not limited in embodiments of the present disclosure.

Figure 5:
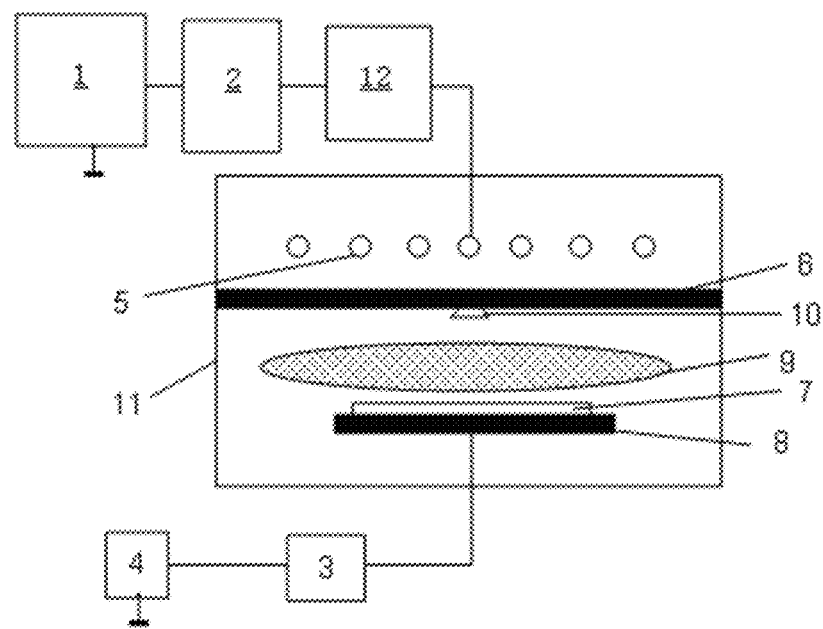
FIG. 5 illustrates a partial schematic structural diagram showing a semiconductor process apparatus according to an embodiment of the present disclosure.
Figure 6:
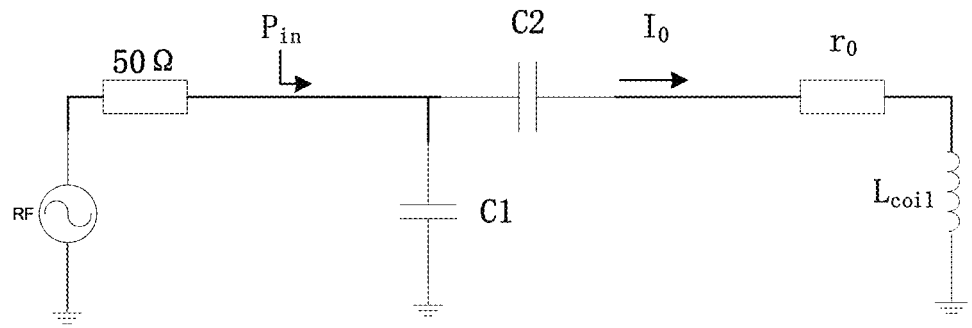
FIG. 6 illustrates a schematic diagram showing an equivalent circuit of an upper electrode radio frequency circuit of a process chamber of a semiconductor process apparatus according to an embodiment of the present disclosure.

Embodiments of the present disclosure do not limit the upper electrode circuit structure of the process chamber. For example, optionally, as shown in FIG. 5 and FIG. 6, an upper electrode circuit is also arranged on the process chamber. The upper electrode power supply 1 can be configured to output electrical energy to the corresponding process chamber 11 through the corresponding upper electrode circuit (including but not limited to the matcher 2, a current detection device 12, the inductive coupling coil (i.e., the RF coil) 5, and cables connecting the corresponding members). For each process chamber, the load carried by the upper electrode power supply when performing the semiconductor process step can include a circuit load of the upper electrode circuit (i.e., the circuit load $r_0$ shown in FIG. 4) and the load of the plasma generated in the process chamber 11 (i.e., the plasma load $r_s$ shown in FIG. 4). Through the calculation, the load $P_p$ eventually applied to the plasma satisfies the following equation:

$$P_p = P_{in} \times [r_s/(r_s + r_0)]$$

where $P_{in}$ denotes the output power of the upper electrode power supply (i.e., the RF generator) 1, $r_s$ denotes the plasma load of the reference process chamber, and $r_0$ denotes the load of the upper electrode circuit.

It should be noted that whether the reference process chamber or other process chambers, the circuit load $r_0$ above can remain unchanged when the process is performed, while the plasma load $r_s$ can vary with different process steps (generally ranging from 0.8Ω to 2.2Ω). However, within the same semiconductor process step, the plasma load $r_s$ can remain unchanged. Based on this, the circuit load $r_0$ can be used to reflect the upper electrode loss characteristics between different chambers and compensate for the differences in the load $P_p$ applied to the plasma between other process chambers and the reference process chamber. Thus, the loads $P_p$ can be the same between different chambers, thereby improving the parameter consistency of the plasma in different process chambers to further improve the process result consistency.

Figure 12:
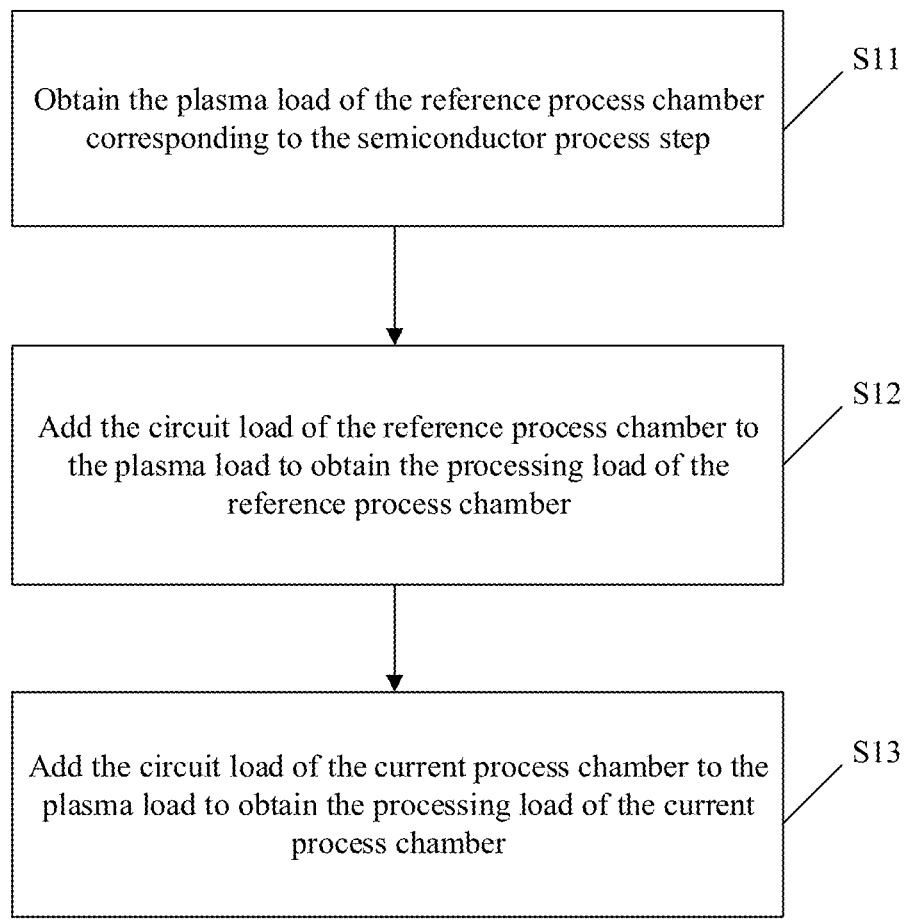
FIG. 12 illustrates a schematic flowchart of step 10 according to an embodiment of the present disclosure.

For example, before adjustment, for the same semiconductor process step, the load applied to the plasma in the reference process chamber is $P_{p1} = P_{in} \times [r_s/(r_s + r_{01})]$, while the load applied to the plasma in the certain current process chamber is $P_{p2} = P_{in} \times [r_s/(r_s + r_{02})]$. The difference between $P_{p1}$ and $P_{p2}$ is caused by $r_{01}$ and $r_{02}$. Based on this, as shown in FIG. 12, the above step S10 specifically includes:

at S11, obtaining the plasma load $r_s$ of the reference process chamber corresponding to the semiconductor process step;

at S12, adding the circuit load $r_{01}$ of the reference process chamber to the plasma load $r_s$ to obtain the processing load $(r_s + r_{01})$ of the reference process chamber; and at S13, adding the circuit load $r_{02}$ of the current process chamber to the plasma load $r_s$ to obtain the processing load $(r_s + r_{02})$ of the current process chamber.

In this case, the above step S20 specifically includes:
calculating the ratio of the processing load $(r_s + r_{02})$ of the current process chamber to the processing load $(r_s + r_{01})$ of the reference process chamber and using this ratio as the power compensation coefficient $\alpha$. That is, $\alpha = (r_s + r_{02})/(r_s + r_{01})$. Thus, the load applied to the plasma in the current process chamber is $P_{p2} = P_{in} \times [r_s/(r_s + r_{02})] \times \alpha = P_{in} \times [r_s/(r_s + r_{02})] \times [(r_s + r_{02})/(r_s + r_{01})]$, which is equal to the load $P_{p1}$ applied to the plasma in the reference process chamber.

The power adjustment method of embodiments of the present disclosure can include obtaining the power compensation coefficient for the current process chamber relative to the reference process chamber according to the processing load of the upper electrode power supply of the reference process chamber and the processing load of the upper electrode power supply of the current process chamber corresponding to the semiconductor process step, and controlling the upper electrode power supply of the current process chamber to output the compensation power. The compensation power can be equal to the product of the set power of the upper electrode power supply of the current process chamber corresponding to the semiconductor process step and the corresponding power compensation coefficient. Thus, the power applied to the plasma of the current process chamber can be consistent with the reference process chamber to improve the consistency of the parameters of the plasma in different process chambers to further improve the process result consistency.

Figure 13:
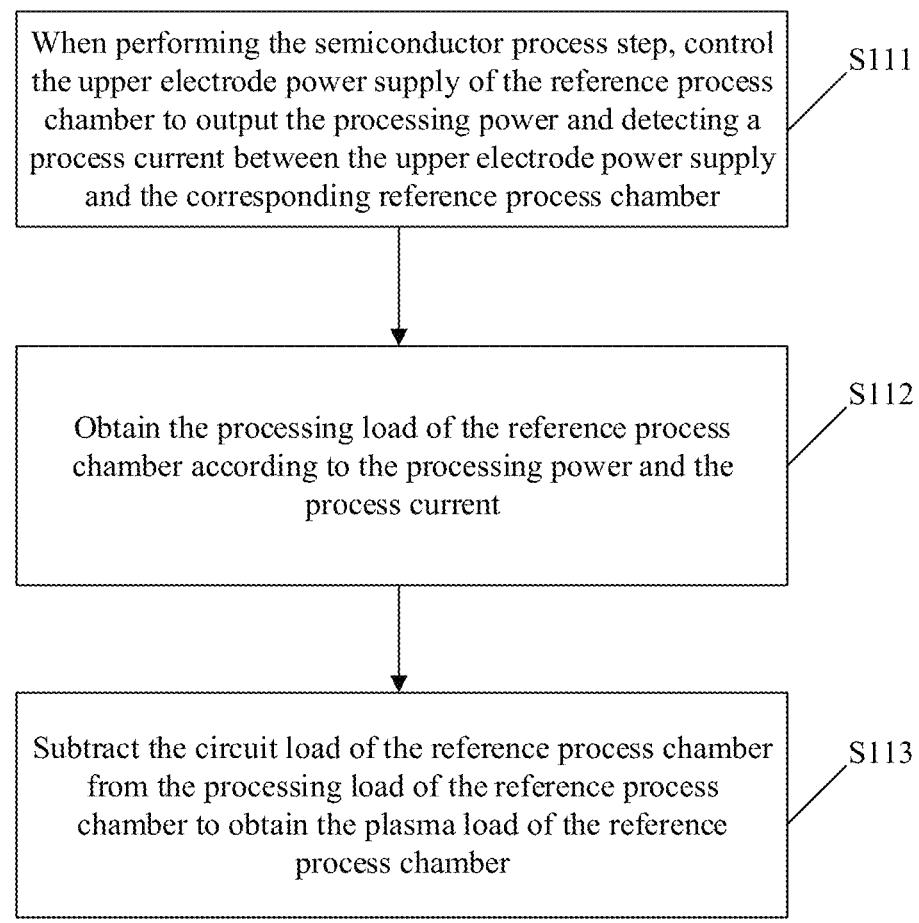
FIG. 13 illustrates a schematic flowchart of step 11 according to an embodiment of the present disclosure.

The plasma load $r_s$ of the reference process chamber corresponding to the semiconductor process step can be obtained in different manners. For example, as shown in FIG. 13, step S11 specifically includes:

at S111, when performing the semiconductor process step, controlling the upper electrode power supply of the reference process chamber to output the processing power P and detecting a process current I between the upper electrode power supply and the corresponding reference process chamber;

at S112, obtaining the processing load $(r_s + r_{01})$ of the reference process chamber according to the processing power P and the process current I; and at S113, subtracting the circuit load $r_{01}$ of the reference process chamber from the processing load $(r_s + r_{01})$ of the reference process chamber to obtain the plasma load $r_s$ of the reference process chamber.

In embodiments of the present disclosure, the plasma load $r_s$ of the reference process chamber can be obtained by performing the semiconductor process detection once on the reference process chamber. That is, the processing loads of other process chambers can be obtained corresponding to the same semiconductor process step through calculation. Thus, the efficiency of obtaining the processing load can be improved to further improve the calculation efficiency of the power compensation coefficient α.

In some embodiments, step S112 specifically includes:
calculating the ratio of the square of the processing power P to the square of the process current I ($P/I^2$) and using it as the processing load ($r_s+r_{O1}$).

In some embodiments, in step S12 and step S13, the circuit load $r_0$ of any process chamber of the reference process chamber and the current process chamber can be obtained by:
controlling the upper electrode power supply to output detection power $P_0$ of the process chamber and detecting the detection current $I_0$ between the upper electrode power supply and the process chamber, the plasma being not ignited in the process chamber under the detection power $P_0$; and
obtaining the circuit load $r_0$ of the process chamber according to the detection power $P_0$ and the detection current $I_0$ of the process chamber.

It should be noted that the detection power $P_0$ above is generally lower than the output power $P_{in}$ of the RF generator 1 when the semiconductor process step is performed. Thus, the detection power $P_0$ can be completely consumed on the upper electrode circuit without causing plasma ignition in the chamber. Thus, no plasma load is generated.

In some embodiments, obtaining the circuit load $r_0$ of the process chamber according to the detection power P0 and the detection current I0 of the process chamber specifically includes:
calculating the ratio of the detection power $P_0$ to the square of the detection current $I_0$ ($P_0/I_0^2$) and using the ratio as the circuit load $r_0$.

Figure 9:
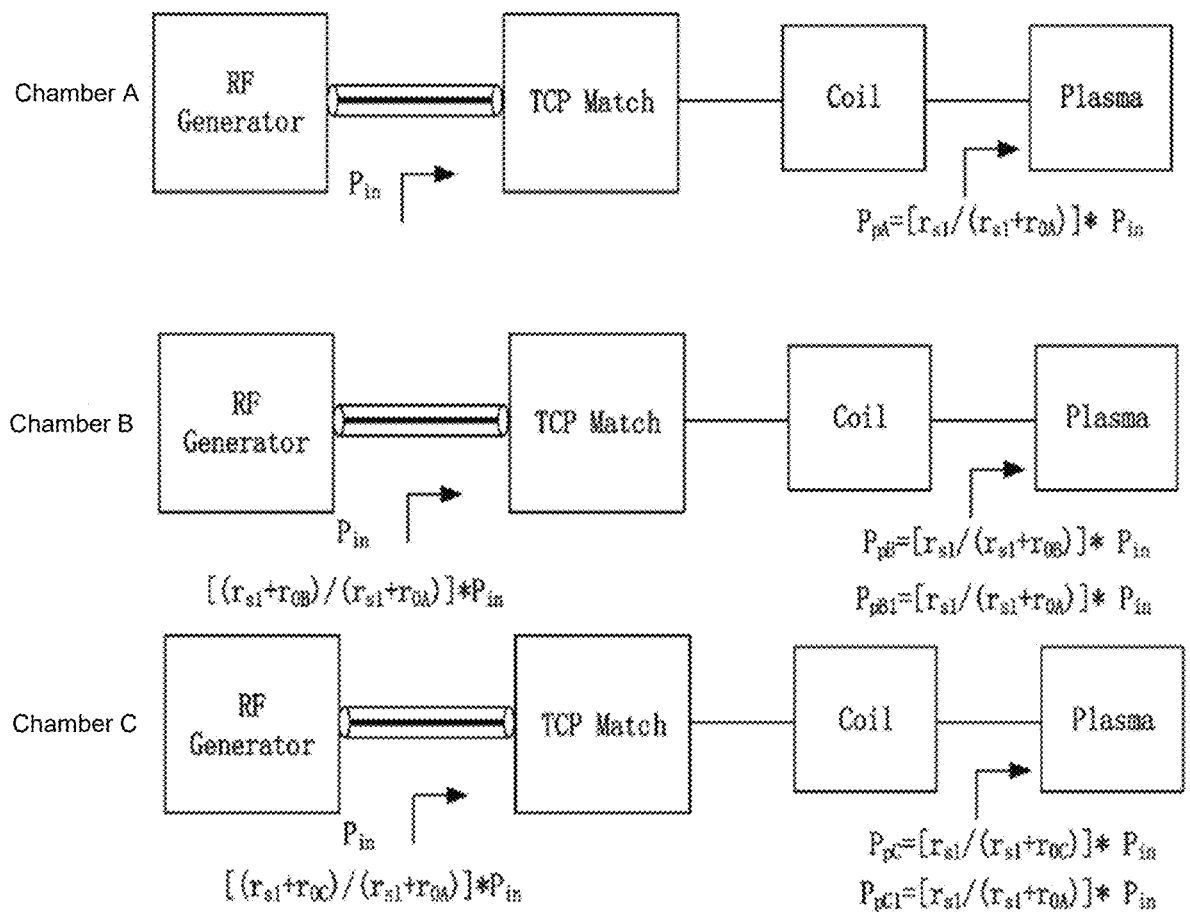
FIG. 9 illustrates a schematic principle diagram showing obtaining processing loads of different process chambers and process compensation coefficients in the power adjustment method of a power supply of an upper electrode of a semiconductor process apparatus according to an embodiment of the present disclosure.

In a specific embodiment, as shown in FIG. 9, when semiconductor process step 1 is performed by using chamber A, chamber B, and chamber C, taking chamber A as the reference process chamber for example, the plasma load $r_{s1}$ of the reference process chamber (i.e., chamber A) corresponding to semiconductor process step 1 is obtained first. Then, the processing load ($r_{s1}+r_{OA}$) of the reference process chamber (i.e., chamber A), the processing load ($r_{s1}+r_{OB}$) of chamber B, and the processing load ($r_{s1}+r_{OC}$) of chamber C corresponding to semiconductor process step 1 are calculated. Subsequently, the ratios (i.e., power compensation coefficient) of the processing load of chamber B to the processing load of chamber A and the processing load of chamber C to the processing load of chamber A are obtained, respectively.

As shown in FIG. 9, for semiconductor process step 1, the power compensation coefficient of chamber B is ($r_{s1}+r_{OB}$)/($r_{s1}+r_{OA}$). The input power $P_{in}$ of chamber A is eventually applied to the plasma in chamber A with a load of $P_{pA1}$=[$r_{s1}/(r_{s1}+r_{OA})$]×$P_{in}$. Before adjustment, the input power $P_{in}$ of chamber B is loaded to the plasma in chamber B with a load of $P_{pB1}$=[$r_{s1}/(r_{s1}+r_{OB})$]×$P_{in}$. After adjusting the input power of chamber B according to the compensation coefficient ($r_{s1}+r_{OB}$)/($r_{s1}+r_{OA}$) to [($r_{s1}+r_{OB}$)/($r_{s1}+r_{OA}$)]×$P_{in}$, the load applied to the plasma of chamber B is:

$$P_{pB1}=[r_{s1}/(r_{s1}+r_{OB})]\times[(r_{s1}+r_{OB})/(r_{s1}+r_{OA})]\times P_{in}=[r_{s1}/(r_{s1}+r_{OA})]\times P_{in}$$

That is, the load $P_{pB1}$ applied to the plasma of chamber B is equal to the load $P_{pA1}$ applied to the plasma of chamber A, which improves the process result consistency between chamber B and the reference process chamber (i.e., chamber A).

Similarly, for semiconductor process step 1, the power compensation coefficient of chamber C can be ($r_{s1}+r_{OC}$)/($r_{s1}+r_{OA}$). Before the adjustment of the output power $P_{in}$ of chamber C, the load applied to the plasma in chamber C is $P_{pC1}$=[$r_{s1}/(r_{s1}+r_{OC})$]×$P_{in}$. After adjusting the input power of chamber C to [($r_{s1}+r_{OC}$)/($r_{s1}+r_{OA}$)]×$P_{in}$ according to the compensation coefficient ($r_{s1}+r_{OC}$)/($r_{s1}+r_{OA}$), the load applied to the plasma of chamber C is:

$$P_{pC1}=[r_{s1}/(r_{s1}+r_{OC})]\times[(r_{s1}+r_{OC})/(r_{s1}+r_{OA})]\times P_{in}=[r_{s1}/(r_{s1}+r_{OA})]\times P_{in}$$

That is, the load $P_{pC1}$ applied to the plasma of chamber C can be equal to the load PpA1 applied to the plasma of chamber A, which improves the process result consistency between chamber C and the reference process chamber (i.e., chamber A).

Figure 10:
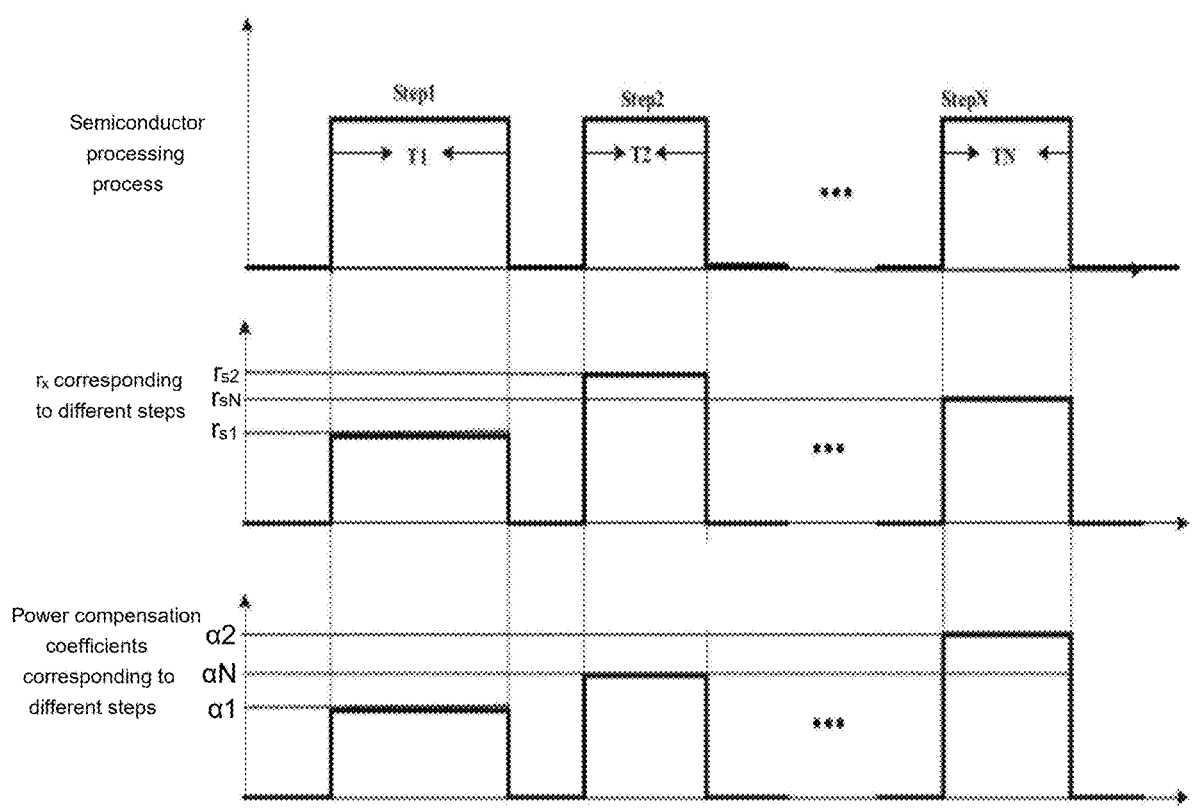
FIG. 10 illustrates a schematic diagram showing a time sequence of continuously performing a plurality of semiconductor process steps by a semiconductor process apparatus according to an embodiment of the present disclosure.

In some optional embodiments, as shown in FIG. 10, a plurality of semiconductor process steps are provided, denoted as Step1, Step2, . . . , StepN, where N is an integer greater than 1. Process times corresponding to the number N process steps are T1, T2, . . . , TN, respectively. In this case, after performing step S11 and before performing all the semiconductor process steps, the power adjustment method of the upper electrode power supply of embodiments of the present disclosure further includes:
writing the obtained plasma loads ($r_{s1}$, $r_s2$, . . . , $I_{sN}$) corresponding to the semiconductor process steps of the reference process chamber into a parameter table, as shown in Table 1-1 below; and

TABLE 1-1

Plasma Loads Corresponding to Different Process Steps

| Step | $r_s$ |
|---|---|
| 1 | $r_{s1}$ |
| 2 | $r_{s2}$ |
| ... | ... |
| N | $r_{sN}$ | accessing the circuit load of the reference chamber and the circuit load of the current process chamber.

Based on the above, step S20 includes:
when performing a first semiconductor process step Step1, accessing the plasma load $r_{s1}$ in the above parameter table of the reference process chamber corresponding to the current first semiconductor process step Step1;
performing step S12 and step S13 to obtain the processing load of the current process chamber;
determining the power compensation coefficient α1 of the current process chamber relative to the reference process chamber corresponding to the first semiconductor process step Step1 according to the processing load of the current process chamber and the processing load of the reference process chamber;
controlling the upper electrode power supply of the current process chamber to output the compensation power after being compensated by the power compensation coefficient; and
after completing the first semiconductor process step Step1, starting to perform a second semiconductor process step Step2. The power adjustment process for Step2 is the same as the power adjustment process for Step1, which is not repeated here.

Figure 7:
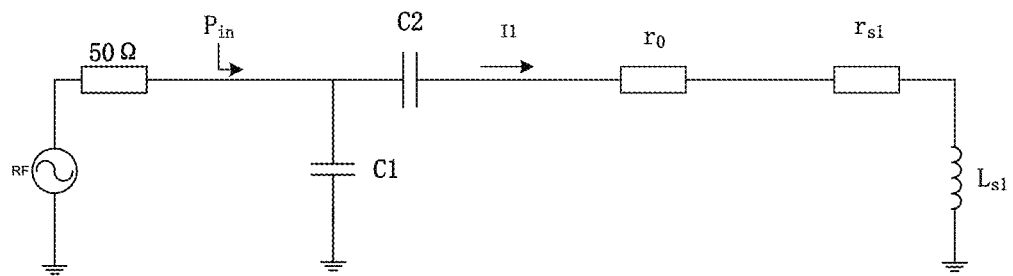
FIG. 7 illustrates a schematic diagram showing an equivalent circuit when a semiconductor process step is performed in a process chamber of a semiconductor process apparatus according to an embodiment of the present disclosure.
Figure 8:
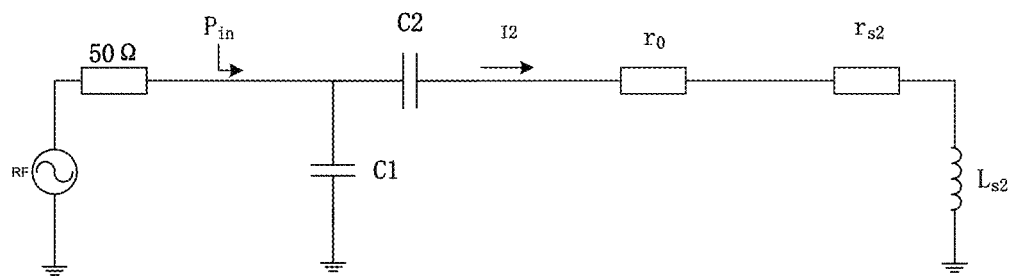
FIG. 8 illustrates a schematic diagram showing an equivalent circuit when another semiconductor process step is performed in a process chamber of a semiconductor process apparatus according to an embodiment of the present disclosure.

As shown in FIG. 7 and FIG. 8, when the first semiconductor process step Step1 is performed, the plasma load $r_{s1}$ (i.e., the real part $r_{s1}$ of the impedance of the process chamber) corresponding to the first semiconductor process step Step1 is obtained according to the input power $P_{in}$ (i.e., processing power P) and the process current $I_1$. When the second semiconductor process step Step2 is performed, the plasma load $r_{s2}$ (i.e., the real part $r_{s2}$ of the impedance of the process chamber) corresponding to the second semiconductor process step Step2 is obtained according to the input power $P_{in}$ (i.e., processing power P) and the process current $I_2$. As shown in FIG. 10, when N semiconductor process steps (Step1, Step2, . . . , StepN) are performed in sequence, the compensation coefficients $\alpha$ ($\alpha$1, $\alpha$2, . . . , $\alpha$N) corresponding to the N process steps are quickly calculated by directly accessing the plasma loads corresponding to the N process steps, which improves the power adjustment efficiency for the RF generator.

Figure 14:
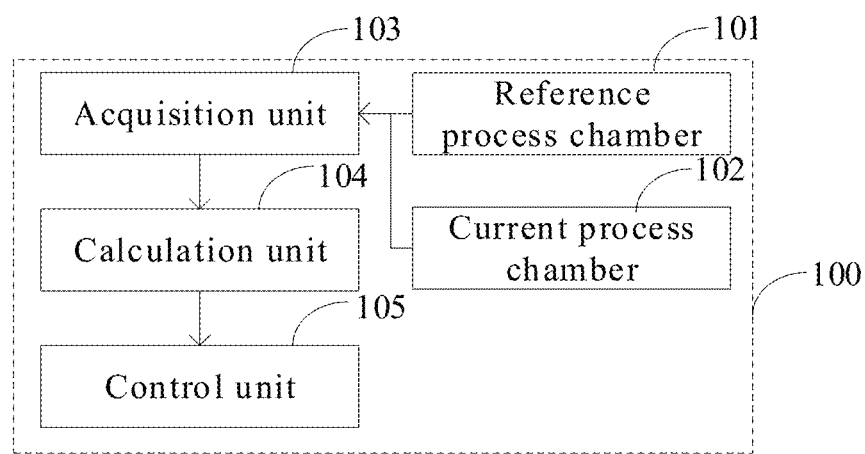
FIG. 14 illustrates a schematic principle block diagram of a semiconductor process apparatus according to an embodiment of the present disclosure.

A second aspect of the present disclosure provides a semiconductor process apparatus. The semiconductor process apparatus can be configured to adjust the power of the upper electrode power supply of at least one process chamber in the power adjustment method of the upper electrode power supply of embodiments of the present disclosure. As shown in FIG. 14, the semiconductor process apparatus 100 includes a plurality of process chambers. Any one process chamber of the plurality of process chambers is used as a reference process chamber 101. A current process chamber of the other process chambers that performs the semiconductor process step is used as a current process chamber 102 (FIG. 14 only shows one current process chamber 102).

The present disclosure does not specifically limit the output frequency of the upper electrode power supply for any process chamber. For example, optionally, the output frequency of the upper electrode power supply can be 13.56 MHz.

The semiconductor process apparatus 100 of embodiments of the present disclosure includes:

an acquisition unit 103 configured to obtain the processing load of the upper electrode power supply for the reference process chamber 101 and the processing load of the upper electrode power supply for the current process chamber 102 corresponding to the semiconductor process steps;

a calculation unit 104 configured to determine the power compensation coefficient of the current process chamber 102 relative to the reference process chamber 101 corresponding to the semiconductor process step according to the processing load of the current process chamber 102 and the processing load of the reference process chamber 101; and a control unit 105 configured to control the upper electrode power supply to output the compensation power of the current process chamber 102 when the semiconductor process step is performed, the compensation power being a product of the set power of the upper electrode power supply of the current process chamber 102 corresponding to the semiconductor process step and the corresponding power compensation coefficient.

In some embodiments, as shown in FIG. 5, the acquisition unit 103 includes a plurality of current detection devices 12. A number of the plurality of current detection devices 12 is the same as the number of the process chambers (including the reference process chamber 101 and all other process chambers). The current detection devices 12 are arranged between the upper electrode power supplies and the corresponding process chambers in a one-to-one correspondence. The current detection device 12 can be configured to obtain the process current and/or the detection current between the corresponding upper electrode power supply and the corresponding process chamber. The detection current refers to the current outputted by the upper electrode power supply when the plasma ignition is not initiated in the process chamber.

The above current detection device 12 can be configured to obtain the process current between the corresponding upper electrode power supply and the corresponding process chamber. The processing load of the reference process chamber can be obtained according to the processing power and the process current to calculate the plasma load $r_s$ of the reference process chamber. The above current detection device 12 can be configured to obtain the detection current between the corresponding upper electrode power supply and the corresponding process chamber to obtain the circuit load $r_0$ of the process chamber. Thus, the processing load of the upper electrode power supply of the reference process chamber and the processing load of the upper electrode power supply of the current process chamber corresponding to the semiconductor process step can be further calculated.

In some embodiments, the above calculation unit 104 and the control unit 105 can be a controller.

In summary, with the power adjustment method and the semiconductor process apparatus of embodiments of the present disclosure, the power compensation coefficient of the current process chamber relative to the reference process chamber can be obtained according to the processing load of the upper electrode power supply of the reference process chamber and the processing load of the upper electrode power supply of the current process chamber corresponding to the semiconductor process step. The upper electrode power supply of the current process chamber can be controlled to output the compensation power. The compensation power can be the product of the set power of the upper electrode power supply of the current process chamber corresponding to the semiconductor process step and the corresponding power compensation coefficient. Thus, the power applied to the plasma in the current process chamber can remain consistent with the power applied to the plasma in the reference process chamber to improve the parameter consistency of the plasma in different process chambers to further improve the process result consistency.

It should be understood that the above embodiments are merely exemplary embodiments used to explain the principles of the present disclosure. However, the present disclosure is not limited to this. Those skilled in the art can make various modifications and improvements without departing from the spirit and essence of the present disclosure. Those modifications and improvements are within the scope of the present disclosure.

What is claimed is:

1. A power adjustment method of an upper electrode power supply of a semiconductor process apparatus, comprising:

obtaining a processing load of an upper electrode power supply of a reference process chamber and a processing load of an upper electrode power supply of a current process chamber corresponding to a semiconductor process step;

when starting the semiconductor process step, determining a power compensation coefficient corresponding to the semiconductor process step for the current process chamber relative to the reference process chamber according to the processing load of the current process chamber and the processing load of the reference process chamber, the processing load of the current process chamber being a sum of a circuit load of the current process chamber and a plasma load corresponding to the semiconductor process step, the processing load of the reference process chamber being a sum of a circuit load of the reference process chamber and the plasma load of the semiconductor processes; and controlling the upper electrode power supply of the current process chamber to output a compensation power during the semiconductor process steps, the compensation power being a product of a set power of the upper electrode power supply of the current process chamber corresponding to the semiconductor process step and the corresponding power compensation coefficient.

2. The power adjustment method according to claim 1, wherein the compensation coefficient is a ratio between the processing load of the current process chamber and the processing load of the reference process chamber.

3. The power adjustment method according to claim 1, wherein:

upper electrode circuits are arranged at the reference process chamber and the current process chamber;

the upper electrode power supply is configured to output power to a corresponding process chamber through a corresponding upper electrode circuit; and obtaining the processing load of the upper electrode power supply of the reference process chamber and the processing load of the upper electrode power supply of the current process chamber corresponding to the semiconductor process step includes:

obtaining the plasma load corresponding to the semiconductor process step;

adding the circuit load of the reference process chamber and the plasma load of the semiconductor processes to obtain the processing load of the reference process chamber performing the semiconductor processes; and adding the circuit load of the current process chamber and the plasma load of the performed semiconductor processes to obtain the processing load of the current process chamber performing the corresponding semiconductor processes.

4. The power adjustment method according to claim 3, wherein obtaining the plasma load corresponding to the semiconductor process step includes:

when performing the semiconductor process step, controlling the upper electrode power supply of the reference process chamber to output a processing power and detecting a process current between the upper electrode power supply and the reference process chamber;

obtaining the processing load of the reference process chamber according to the processing power and the process current; and subtracting the circuit load of the reference process chamber from the processing load of the reference process chamber to obtain the plasma load corresponding to the semiconductor process step.

5. The power adjustment method according to claim 4, wherein the processing load is a ratio of the processing power to square of the process current.

6. The power adjustment method according to claim 3, wherein obtaining the circuit load of any one of the reference process chamber and the current process chamber includes:

controlling the upper electrode power supply of the process chamber to output detection power to detect a detection current between the upper electrode power supply and the process chamber, the plasma being not ignited in the process chamber under the detection power; and obtaining the circuit load of the process chamber according to the detection power and detection current of the process chamber.

7. The power adjustment method according to claim 6, wherein the circuit load is a ratio of the detection power to square of the detection current.

8. A semiconductor process apparatus comprising:

a plurality of process chambers, the semiconductor process apparatus being configured to adjust power of upper electrode power supplies of the plurality of process chambers, any one process chamber of the plurality of process chambers being used as a reference process chamber, a process chamber of the other process chambers that performs a semiconductor process step being a current process chamber;

an acquisition unit configured to obtain a processing load of an upper electrode power supply of the reference process chamber and a processing load of an upper electrode power supply of the current process chamber corresponding to the semiconductor process step;

a calculation unit configured to, when starting the semiconductor process step, determine a power compensation coefficient corresponding to the semiconductor process step for the current process chamber relative to the reference process chamber according to the processing load of the current process chamber and the processing load of the reference process chamber, the processing load of the current chamber being a sum of a circuit load of the current process chamber and a plasma load corresponding to the semiconductor process step, the processing load of the reference process chamber being a sum of a circuit load of the reference process chamber and the plasma load of the semiconductor processes; and a control unit configured, when performing the semiconductor process step to control the upper electrode power supply of the current process chamber to output a compensation power, the compensation power being a product of a set power of the upper electrode power supply of the current process chamber corresponding to the semiconductor process step and the corresponding power compensation coefficient.

9. The semiconductor process apparatus according to claim 8, further comprising:

the plurality of process chambers, one process chamber being able to be used as the reference process chamber, the power of the upper electrode supply of other process chambers being adjusted through the power adjustment method.

10. The semiconductor process apparatus according to claim 8, further comprising:

a plurality of current detection devices, a number of the plurality of current detection devices being same as a number of the process chambers, and the current detection devices being arranged between the electrode power supplies and the corresponding process chambers in a one-to-one correspondence, the current detection devices being configured to obtain a process current and/or a detection current between the corresponding upper electrode power supplies and the corresponding process chambers, and the detection current referring to a current outputted by the upper electrode power supply when the plasma is not ignited in the process chamber.

11. The power adjustment method according to claim 4, further comprising:

storing the plasma load corresponding to the semiconductor process step in a data structure for later access.

12. The power adjustment method according to claim 11, wherein the data structure comprises a respective plasma load value corresponding to each of a plurality of semiconductor process steps including the semiconductor process step.

* * * * *